(12) United States Patent
Chang

(10) Patent No.: US 9,035,730 B2
(45) Date of Patent: May 19, 2015

(54) MAGNETIC TRIGGER MECHANISM AND ASSOCIATED CONTROL METHOD

(71) Applicant: Ching-Tang Chang, Taipei (TW)

(72) Inventor: Ching-Tang Chang, Taipei (TW)

( * ) Notice: Subject to any disclaimer, the term of this patent is extended or adjusted under 35 U.S.C. 154(b) by 0 days.

(21) Appl. No.: 14/248,734

(22) Filed: Apr. 9, 2014

(65) Prior Publication Data

US 2014/0218142 A1 Aug. 7, 2014

Related U.S. Application Data

(62) Division of application No. 13/033,281, filed on Feb. 23, 2011, now Pat. No. 8,729,989.

(30) Foreign Application Priority Data

Mar. 10, 2010 (TW) .............................. 99106873 A

(51) Int. Cl.
*H01H 36/00* (2006.01)
*G01R 33/07* (2006.01)
*H03K 17/95* (2006.01)
*H03K 17/97* (2006.01)

(52) U.S. Cl.
CPC ........... *H01H 36/0066* (2013.01); *H01H 36/00* (2013.01); *G01R 33/072* (2013.01); *H01H 36/0006* (2013.01); *H01H 36/006* (2013.01); *H03K 17/95* (2013.01); *H03K 17/97* (2013.01)

(58) Field of Classification Search
CPC ............................... H01H 36/00; H03K 17/97
USPC .................................................. 335/205–207
See application file for complete search history.

(56) References Cited

U.S. PATENT DOCUMENTS

| 4,101,857 A | 7/1978 | O'Toole |
| 5,999,072 A | 12/1999 | Slavik |
| 6,864,679 B2 | 3/2005 | Yokoji et al. |
| 7,287,873 B2 * | 10/2007 | Galli .............................. 362/158 |

* cited by examiner

*Primary Examiner* — Ramon Barrera
(74) *Attorney, Agent, or Firm* — WPAT, PC; Justin King

(57) ABSTRACT

A magnetic trigger mechanism is provided. The magnetic trigger mechanism operates in conjunction with a plurality of magnetic sensors. The magnetic trigger mechanism includes: a magnet; a body, with its one side provided with a recess and its other side located near the plurality of magnetic sensors; and a moveable section, provided in the recess in a movable manner, comprising an accommodating space for restraining the magnet therein.

4 Claims, 7 Drawing Sheets

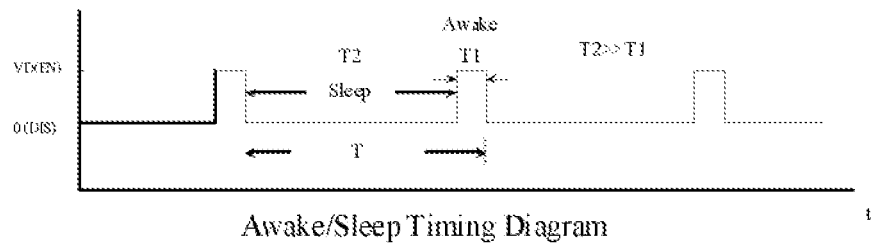
Awake/Sleep Timing Diagram
FIGURE 3
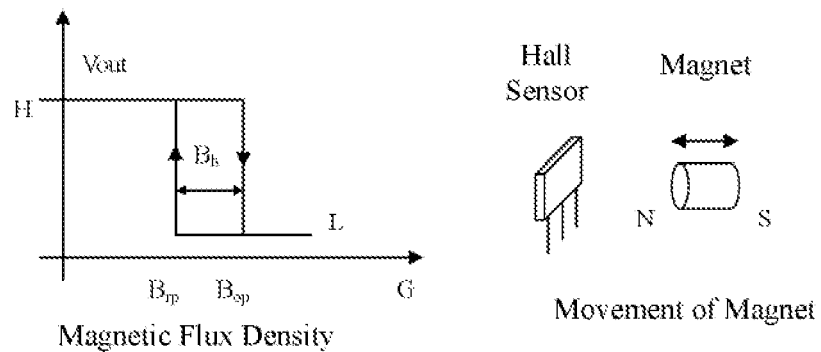
Magnetic Flux Density
Movement of Magnet
FIGURE 4
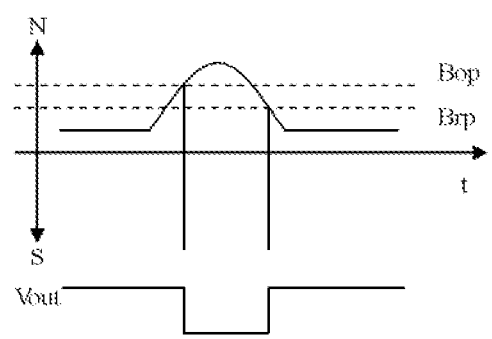
FIGRUE 5

MAGNETIC TRIGGER MECHANISM AND ASSOCIATED CONTROL METHOD

This application is a divisional application of co-pending U.S. application Ser. No. 13/033,281, filed Feb. 23, 2011, which claims the benefit of Taiwan Patent Application No. 099106873, filed Mar. 10, 2010, the subject matter of which is incorporated herein by reference.

FIELD OF THE INVENTION

The present invention relates to a power control apparatus, and more particularly, to a contactless switch.

BACKGROUND OF THE INVENTION

Conventional power switches are contact-operable only. With reference to FIG. 1 showing a block diagram of a conventional power switch 1 comprising a contact trigger mechanism 10 and a switcher 12. The switcher 12 operates, i.e., connects or disconnects a power supply, as the contact trigger mechanism 10 is triggered by a user contact. It is to be noted that the trigger mechanism 10 is a contact-operable only structure, which connects or disconnects a power supply by determining whether a metal touch point is contacted. However, the metal touch point is prone to wear resulted from prolonged friction, or even to poor contact due to metal oxidation.

Therefore, there is a need for a solution that overcomes the drawbacks associated with the conventional power switches.

SUMMARY OF THE INVENTION

It is an objective of the present disclosure to provide a contactless power switch that overcomes drawbacks of wear, oxidation and fatigue due to prolonged friction at an internal touch point of a conventional switch.

To achieve the above objective, the present disclosure provides a magnetic trigger mechanism. The magnetic trigger mechanism, operating in conjunction with a plurality of magnetic sensors, comprises: a magnet; a body, with its one side provided with a recess and its other side located near the magnetic sensors; and a moveable section, adjustably provided in the recess, comprising an accommodating space for restraining the magnet therein.

The present disclosure further provides a method for controlling a magnetic trigger mechanism. The magnetic trigger mechanism comprises a magnet and operates in conjunction with a plurality of magnetic sensors. The method comprises arranging the magnetic sensors in different sensing positions, and generating a magnetic signal corresponding to one of the sensing positions by rendering the magnet to the sensing position by a user to proceed with a corresponding control status.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 3 is a timing diagram illustrating awake and sleep modes;

FIG. 4 is an operating output status of a Hall-effect sensor;

FIG. 5 is a waveform of an output Vout of a Hall-effect sensor;

DETAILED DESCRIPTION OF THE PREFERRED EMBODIMENT

Figure 1:
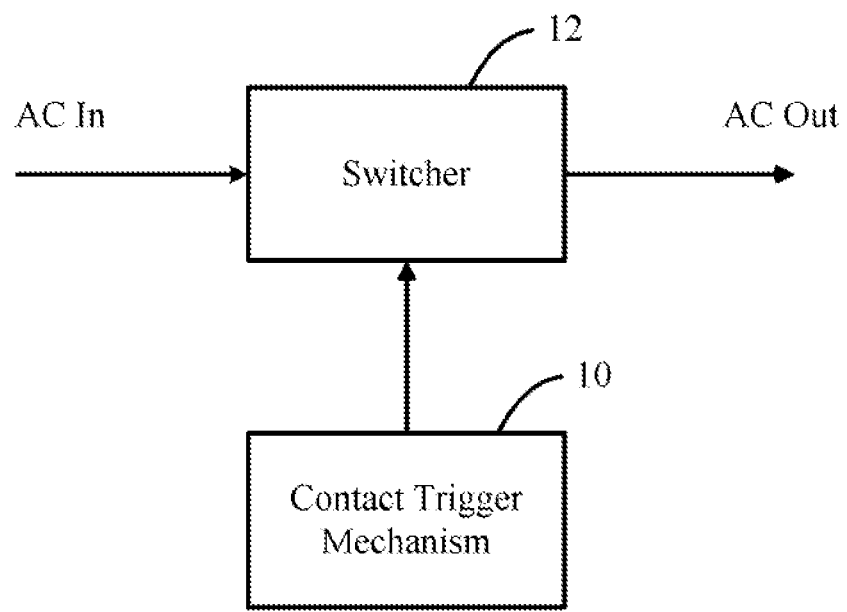
FIG. 1 is a schematic diagram of conventional power switch.
Figure 2:
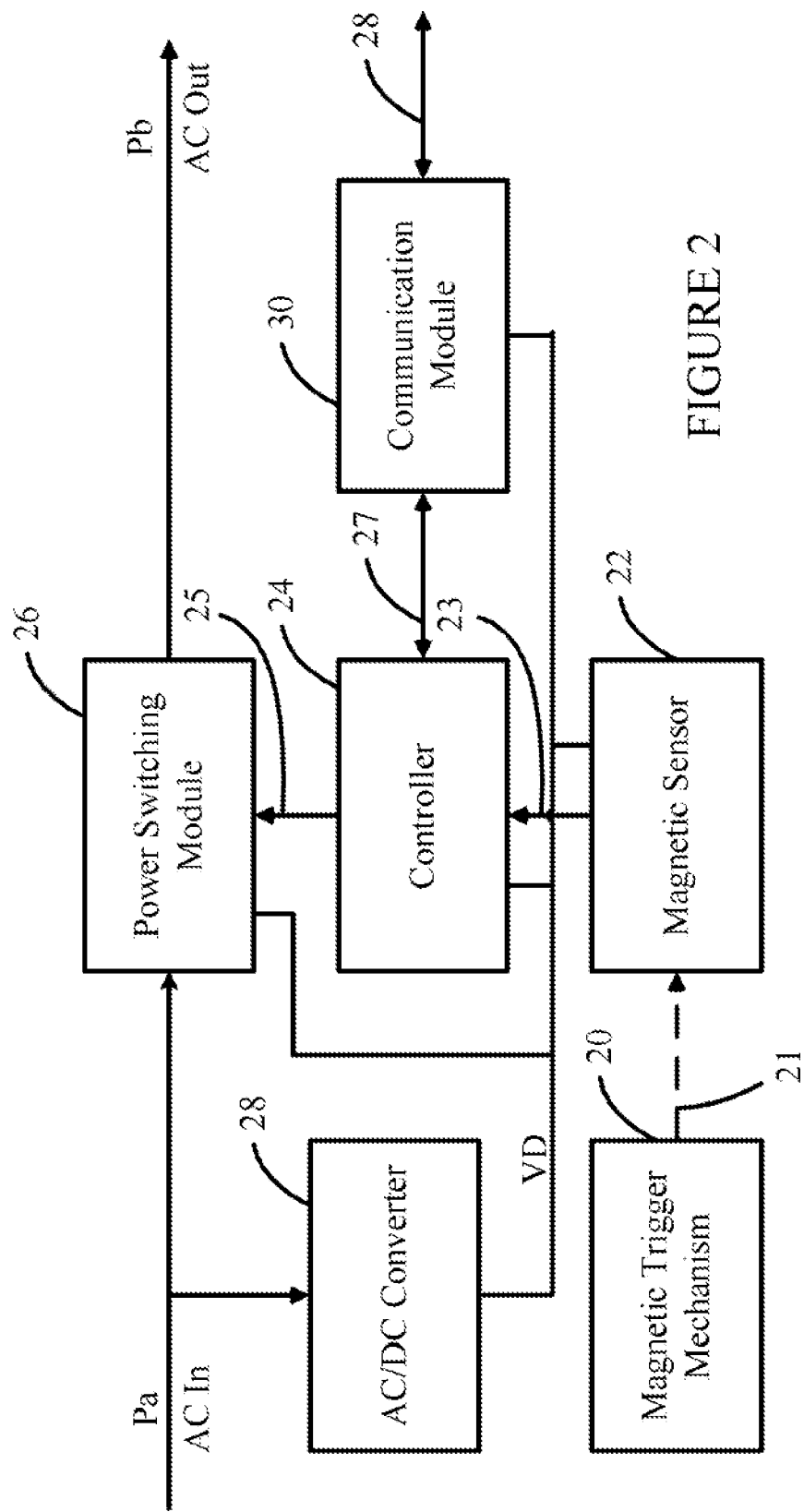
FIG. 2 is a schematic diagram of a contactless power switch according to the present disclosure.

With reference to FIG. 2 showing a schematic diagram of functional blocks of a contactless power switch 2 according to one preferred embodiment of the present disclosure. The contactless power switch 2 comprises a magnetic trigger mechanism 20, a magnetic sensor 22, a controller 24, a power switching module 26, an AC/DC converter 28 and a communication module 30.

The AC/DC converter 28 converts an AC electricity Pa into a DC current VD, which is then provided an operating power to the magnetic sensor 22, the controller 24, the power switching module 26 and the communication module 30 under normal operation. Further, the AC/DC converter 28 also provides DC voltages of different levels to accommodate the magnetic sensor 22, the controller 24, the power switching module 26 and the communication module 30 that operate under different DC voltages, e.g., 3.3V or 5V. It is to be noted that a single DC power VD in FIG. 2 is an illustrative example and is not to be construed as limiting the scope of the present invention.

In order to meet environmental friendly factors of energy conservation and carbon reduction, the contactless switch of the invention is also designed to be power saving. For example, the AC/DC converter 28 is controlled to output the DC power VD by an awake/sleep cycle with a timing diagram as shown in FIG. 3. In FIG. 3, under an awake mode T1, the AC/DC converter 28 outputs the DC power VD to provide an operating voltage to the magnetic sensor 22, the controller 24, the power switching module 26 and the communication module 30. In contrast, under a sleep mode T2, the AC/DC converter 28 is disabled with no DC power VD generated therefrom. Accordingly, lower power dissipation to even no power dissipation is achieved under the sleep mode. Preferably, the awake mode T1 and the sleep mode T2 alternate cyclically, and the duration of the sleep mode T2 is far greater than that the awake mode T1, i.e., T2>>T1.

The magnetic trigger mechanism 20 first receives a user trigger, and the magnetic sensor 22 operates in conjunction to sense the user trigger. According to the contactless power switch 2 of the present disclosure, the magnetic trigger mechanism 20 and the magnetic sensor 22 operate on magnetic basis through a magnetic signal 21 in FIG. 2, i.e., there is no contact between the two, and are therefore free from drawbacks of wear, oxidation and fatigue resulted from prolonged friction at a metal touch point of the conventional power switch. For example, the magnetic trigger mechanism 20 can be a rocker, slide, pushbutton, rotary, toggle, or tact mechanism. By simply disposing a magnet at an appropriate position of the magnetic sensor 22, the magnetic sensor 22 is capable of sensing a user trigger. Preferably, the magnetic sensor 22 can be a Hall-effect sensor, magnetic-resistive sensor, magnetic-inductive sensor, or magnetic-impedance sensor. Once the magnetic signal 21 generated by the magnetic trigger mechanism 20 from the user trigger is sensed by the magnetic sensor 22, a corresponding trigger control signal 23 is generated and provided to the controller 24.

Preferably, the magnetic sensor 22 is realized by utilizing a Hall-effect sensor that detects a position of a magnet through detecting magnetic fields. FIG. 4 shows a schematic diagram of an operating output status of a Hall-effect sensor. As the magnet gets closer to Hall-effect sensor, the magnetic flux density increases till reaching a sensor operating point Bop, at which then an output Vout of the Hall-effect sensor changes from a logic-high level to a logic-low level. In contrast, as the magnet gets farther from the Hall-effect sensor, the magnetic flux density decreases till a sensor magnetism releasing point Brp, at which then the sensor output Vout changes from a logic-low level to a logic-high level. FIG. 5 shows a waveform of an output Vout of a Hall-effect sensor.

Figure 6:
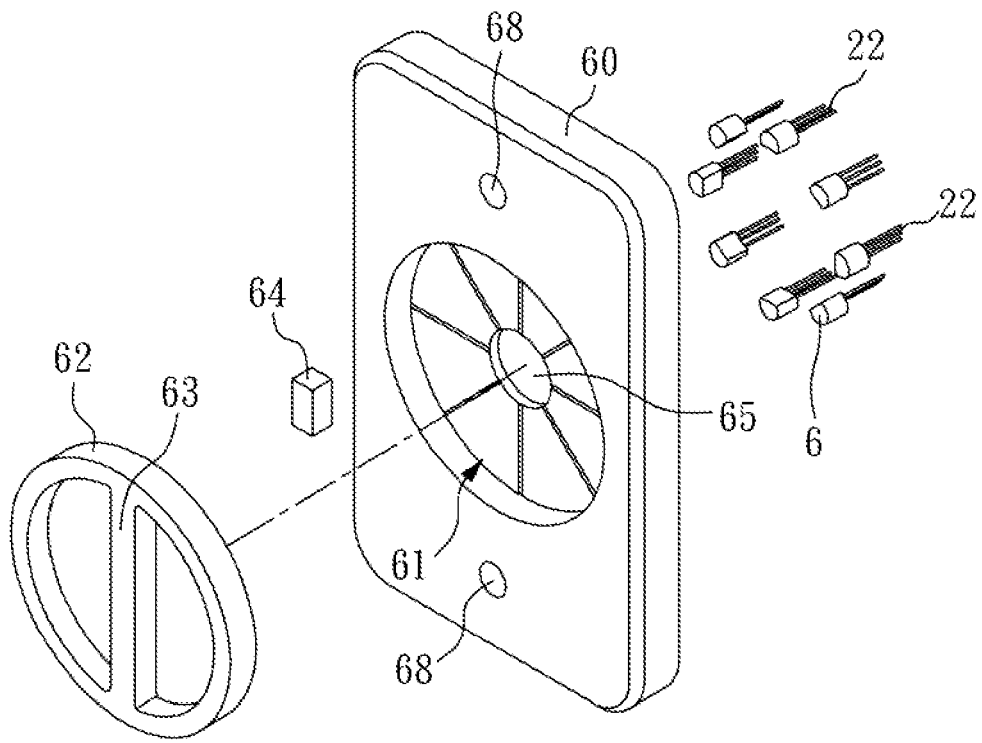
FIGS. 6 to 8 are schematic diagrams of a magnetic trigger mechanism according to a first preferred embodiment of the disclosure.
Figure 7:
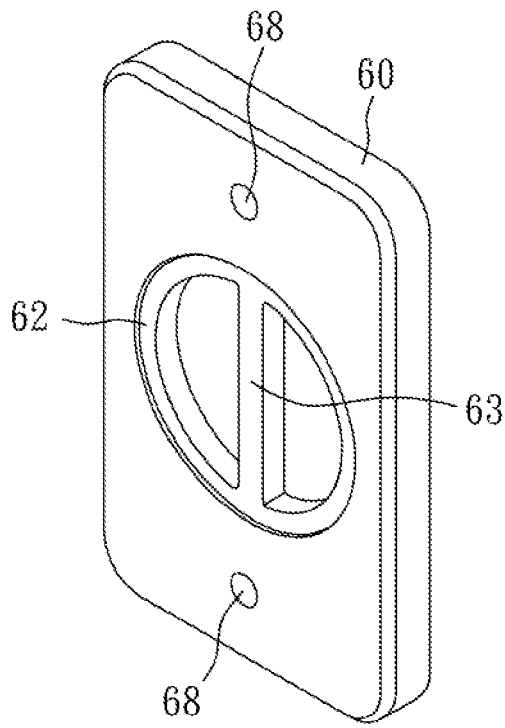
Figure 8:
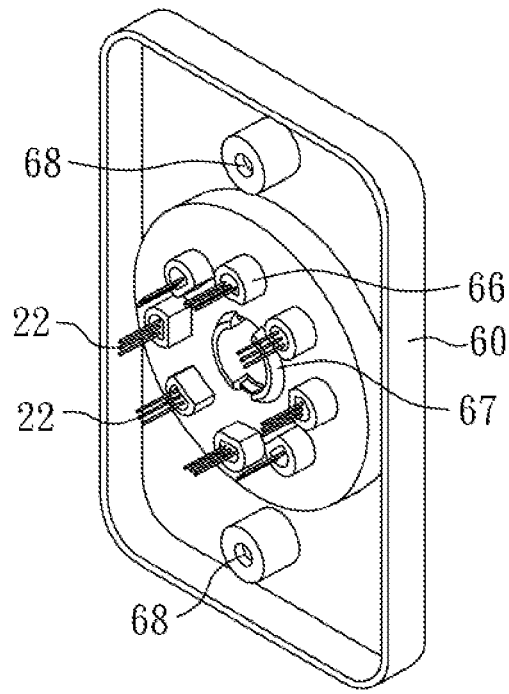

FIGS. 6 to 8 show schematic diagrams of a magnetic trigger mechanism 20 according to a first preferred embodiment of the present disclosure. The magnetic trigger mechanism 20, a rotary mechanism as shown in FIGS. 6 to 8, comprises a body 60, a rotary section 62, and a magnet 64. The body 60 is provided with a round recess 61 having an opening 65 at a center thereof. The round rotary section 62 comprises a protruding portion 67. By coupling the protruding portion 67 to the opening 65, the round rotary section 62 becomes accommodated in the round recess 61 of the body 60. To accomplish the rotary switch mechanism, the round rotary section 62 comprises a radial strip 63 for receiving force applied to the round rotary section 62. A side of the radial strip 63 facing the body 60 is in form of a notch for accommodating the magnet 64. Opposite to the side facing the round rotary section 62, the other side of the round recess 61 of the body 60 comprises a plurality of sockets 66 for respectively accommodating the magnetic sensors 22 therein. In this embodiment, eight magnetic sensors 22 are provided at eight positions corresponding to circular motions of the magnet 64 at the round rotary section 62 to obtain eight switch control statuses. Further, in this embodiment, the body 60 of the magnetic trigger mechanism 20 further comprises fastening openings 68, through which the magnetic trigger mechanism 20 is fixed to a wall, for example, by means of screws or other fastening elements.

In this embodiment, the magnetic sensors 22 are Hall sensors in form of integrated circuits assembled into packages. The packages, for example, are in form of dual-in-line (DIP) or surface-mount technology (SMT). Preferably, a sensing surface 6 of each Hall sensor is arranged as facing the magnet 64 to obtain optimal sensing effects.

Figure 9:
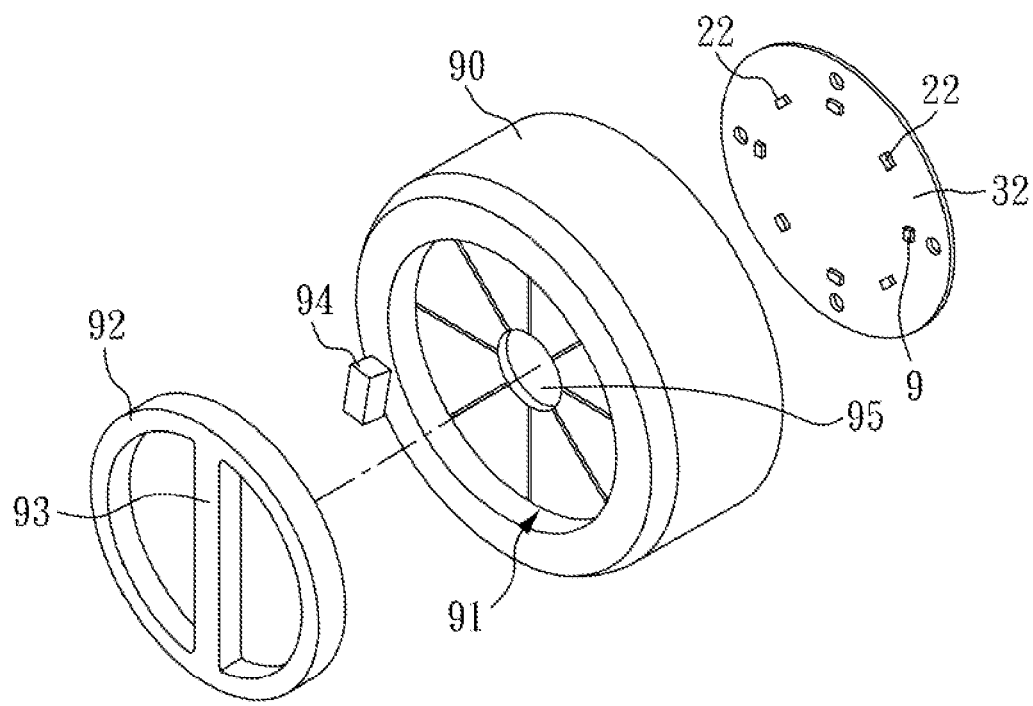
FIGS. 9 to 11 are schematic diagrams of a magnetic trigger mechanism according to a second preferred embodiment of the disclosure.
Figures 10, 11:
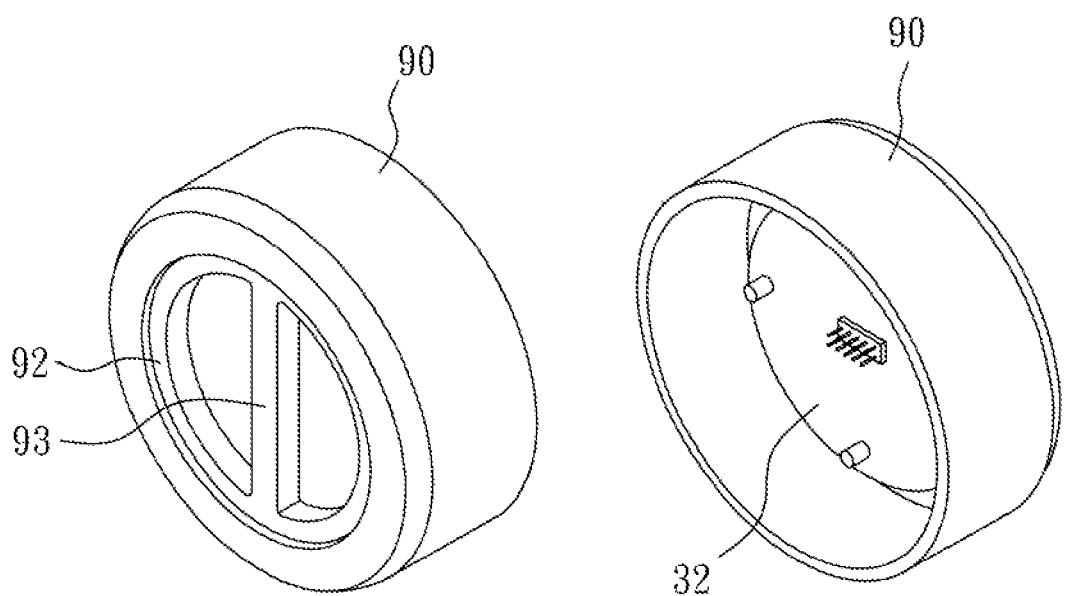

FIGS. 9 to 11 show schematic diagrams of a magnetic trigger mechanism 20 according to a second preferred embodiment of the present disclosure. In this embodiment, the magnetic trigger mechanism 20, also a rotary mechanism comprises a body 90, a rotary section 92, and a magnet 94. The body 90 is provided with a round recess 91 having an opening 95 at a center thereof, so as to accommodate a round rotary section 92 in the round recess 91 of the body 90. To accomplish the rotary switch mechanism, the round rotary section 92 comprises a radial strip 93 for receiving force applied to the round rotary section 92. A side of the radial strip 93 facing the body 90 is in form of a notch for accommodating the magnet 94. In this embodiment, a plurality of magnetic sensors 22 are mounted to a round circuit board 32. Opposite to the side facing the round rotary section 92, the round circuit board 32 is accommodated in the other side of the round recess 91 of the body 90. In this embodiment, eight magnetic sensors 22 are provided at eight positions corresponding to circular motions of the magnet 94 at the round rotary section 92 to obtain eight switch control statuses.

In this embodiment, the magnetic sensors 22 are Hall sensors in form of integrated circuits assembled into packages. The packages, for example, are in form of dual-in-line (DIP) or surface-mount technology (SMT). Preferably, a sensing surface 9 of each Hall sensor is arranged as facing the magnet 94 to obtain optimal sensing effects.

Figure 12:
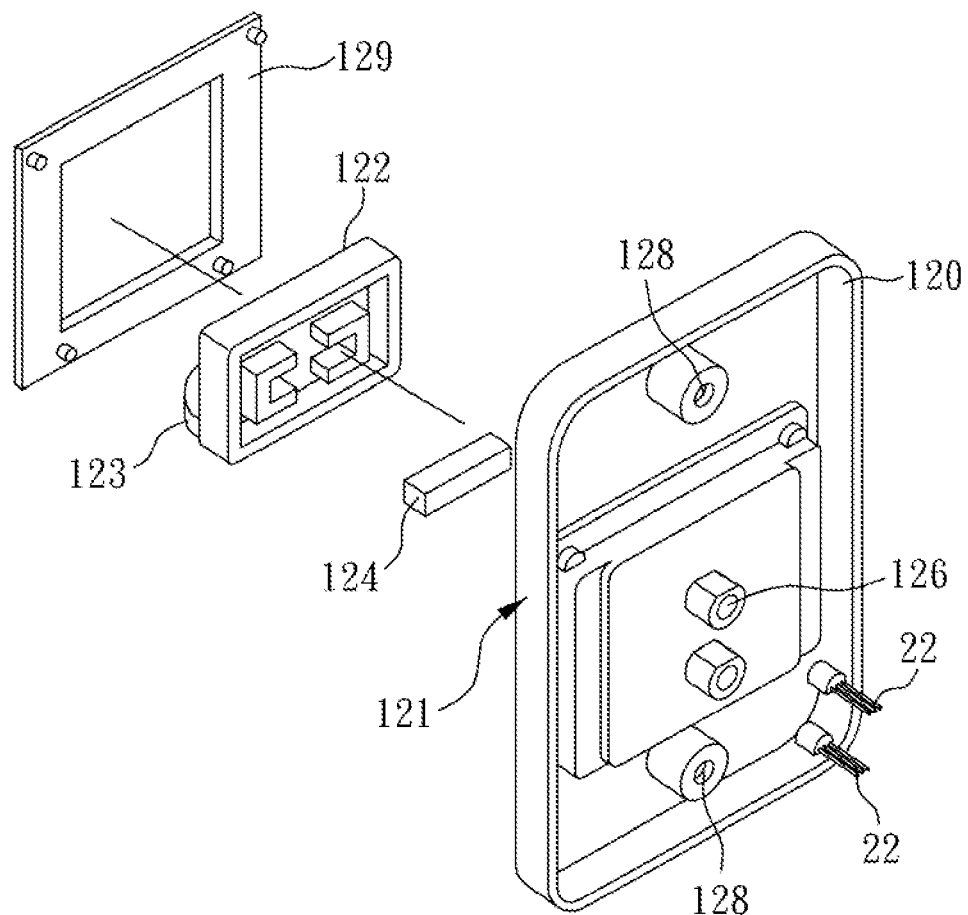
FIGS. 12 to 14 are schematic diagrams of a magnetic trigger mechanism according to a third preferred embodiment of the disclosure.
Figure 13:
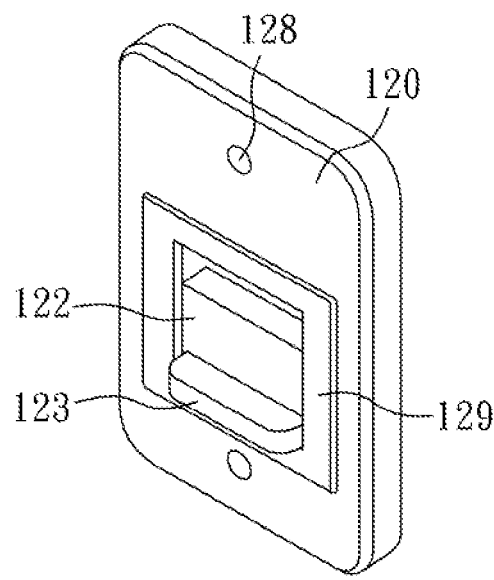
Figure 14:
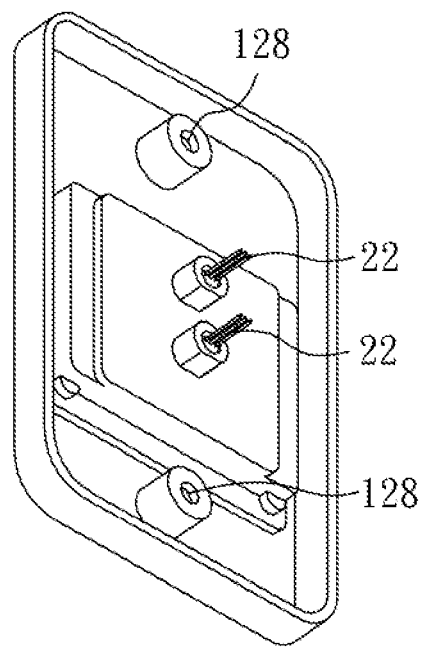

FIGS. 12 to 14 show schematic diagrams of a magnetic trigger mechanism 20 according to a third preferred embodiment of the present disclosure. In this embodiment, the magnetic trigger mechanism 20, being a slide mechanism, comprises a body 120, a sliding section 122, and a magnet 124. The body 120 comprises a quadrilateral recess 121 for accommodating the quadrilateral sliding section 122 therein. Further, a frame 129 with a limiting function is provided to allow the quadrilateral sliding section 122 with only one-dimensional sliding movements. To accomplish the slide mechanism, the quadrilateral sliding section 122 comprises a strip 123 for receiving force applied to the quadrilateral sliding section 122. A side of the strip 123 facing the body 120 is in form of a notch for accommodating the magnet 124. Opposite to the side facing the quadrilateral sliding section 122, the other side of the quadrilateral recess 121 of the body 120 comprises a plurality of sockets 126 for respectively accommodating the magnetic sensors 22 therein. In this embodiment, two magnetic sensors 22 are provided at two positions corresponding to one-dimensional motions of the magnet 124 at the quadrilateral sliding section 122 to obtain two switch control statuses. Further, in this embodiment, the body 120 of the magnetic trigger mechanism 20 further comprises fastening openings 128, through which the magnetic trigger mechanism 20 is fixed to a wall, for example, by means of screws or other fastening elements.

Again referring to FIG. 2, the controller 24 is in charge of an overall operation of the contactless power switch 2. Preferably, the controller 24 is a microprocessor, and controls operations of the various units of the contactless power switch 2 according to predetermined control firmware or software through an internal or external memory (not shown in the drawing). The internal or external memory is, for example, a programmable read-only memory (PROM), an erasable programmable read-only memory (EPROM), and electronically erasable programmable read-only memory (EEPROM), or a flash memory. Upon receiving the trigger control signal 23 generated by the magnetic sensor 22, the controller 24 determines the user trigger upon the contactless power switch 2 and generates a corresponding switch signal 25 to the power switching module 26. The power switching module 26 accordingly performs power switching operations according to the switch signal 25. Further, the power switching module 26 is designed to match operations of the magnetic trigger mechanism 20 and the magnetic sensor 22. For example, for the magnetic trigger mechanism 20 having two statuses of on and off, the power switching module 26 needs provide two statuses of only directly coupling the AC power Pa to the output end to act as a output AC power Pb, or disconnecting the AC power Pa. Supposing the magnetic trigger mechanism 20 provides three or more statuses, the power switching module 26 may then comprise a regulator, a transformer, a switch or a multiplexer, so as to output multiple voltages or currents at the output end of the power switching module 26. For example, the power switching module 26 also comprises an over-voltage or over-current protecting circuit that cuts off the voltage or current in the event of over-current or over-voltage to ensure user safety.

For example, the power switching module 26 would further comprises an AC/DC converter that provides one or multiple DC output currents or output voltages at the output end thereof. It is to be noted that a single AC power at the output end of the power switching module 26 is shown in FIG. 2 for illustrative purposes, and is not to be construed as limiting the scope of the present invention. For example, the output of the power switching module 26 can be an AC power or a DC power under the spirit of the present invention. The switch of the present disclosure may also be applied to a knob for light brightness or volume adjustment, as the term "switch" according to the present disclosure encompasses switches of any form.

Additionally, to satisfy regional security systems, such as a home security system, the contactless power switch of the present invention is connectable to a wired local network, a wireless network (e.g., WiMax or WiFi), or a mobile communication network (e.g., 2G, 3G, or 4G). Hence, the contactless power switch 2 according to the present disclosure further comprises a communication module 30, which establishes a connection through a wired local network, a wireless network or a mobile communication network by transceiving a communication signal 28 (e.g., a wired signal or a wireless signal), so as to enable a user to control the contactless power switch 2 according to the present disclosure at a remote end for functions including turning on and off, time, and adjustment. Further, the communication module 30 is coupled to a bi-directional bus of the controller 24 to accomplish signal transmission and data control by transmitting the control signal 27.

While the invention has been described in terms of what is presently considered to be the most practical and preferred embodiments, it is to be understood that the invention needs not to be limited to the above embodiments. On the other hand, it is intended to cover various modifications and similar arrangements included within the spirit and scope of the appended claims which are to be accorded with the broadest interpretation so as to encompass all such modifications and similar structures.

What is claimed is:

1. A magnetic trigger mechanism, operating in conjunction with a plurality of magnetic sensors, the magnetic trigger mechanism comprising:
   a magnet;
   a body, having a quadrilateral recess on a first side and a plurality of sockets for accommodating said plurality of magnetic sensors on a second side;
   a quadrilateral moveable section, positioned within the quadrilateral recess in a movable manner, comprising an accommodating space for restraining the magnet therein; and
   a cover frame for limiting removal of said quadrilateral moveable section from said quadrilateral recess;
   wherein said plurality of magnetic sensors detect a position of said magnet when said quadrilateral moveable section moves within the quadrilateral recess.

2. The magnetic trigger mechanism as claimed in claim 1, wherein the body further comprises a fastening opening.

3. The magnetic trigger mechanism as claimed in claim 1, wherein the magnetic sensors of the plurality of magnetic sensors are Hall Effect sensors.

4. The magnetic trigger mechanism as claimed in claim 1, wherein said quadrilateral recess has a depth equal to or greater than a thickness of said quadrilateral moveable section, such that said quadrilateral moveable section is entirely disposed within said quadrilateral recess.

* * * * *